United States Patent
Chiba et al.

(10) Patent No.: US 9,103,001 B2
(45) Date of Patent: Aug. 11, 2015

(54) AG—AU—PD TERNARY ALLOY BONDING WIRE

(75) Inventors: Jun Chiba, Saga (JP); Satoshi Teshima, Saga (JP); Tasuku Kobayashi, Saga (JP); Yuki Antoku, Saga (JP)

(73) Assignee: TANAKA DENSHI KOGYO K.K., Tokyo (JP)

( * ) Notice: Subject to any disclaimer, the term of this patent is extended or adjusted under 35 U.S.C. 154(b) by 0 days.

(21) Appl. No.: 13/496,327

(22) PCT Filed: Nov. 1, 2011

(86) PCT No.: PCT/JP2011/075160
§ 371 (c)(1),
(2), (4) Date: Mar. 15, 2012

(87) PCT Pub. No.: WO2012/108082
PCT Pub. Date: Aug. 16, 2012

(65) Prior Publication Data
US 2012/0263624 A1    Oct. 18, 2012

(30) Foreign Application Priority Data

Feb. 10, 2011   (JP) ................................. 2011-027860

(51) Int. Cl.
*C22C 5/06*   (2006.01)
*B21C 37/00*  (2006.01)
(Continued)

(52) U.S. Cl.
CPC . *C22C 5/06* (2013.01); *H01L 24/43* (2013.01); *H01L 24/45* (2013.01); *H01L 24/48* (2013.01);
(Continued)

(58) Field of Classification Search
CPC ..... B23K 35/302; B23K 35/3013; C22C 5/02

USPC .................... 420/505; 257/E23.025; 428/607
See application file for complete search history.

(56) References Cited

U.S. PATENT DOCUMENTS

2008/0050267 A1*  2/2008  Murai et al. .................. 420/508
2010/0239456 A1   9/2010  Lee

FOREIGN PATENT DOCUMENTS

JP    A-60-177639    9/1985
JP    A-3-74851      3/1991
(Continued)

OTHER PUBLICATIONS

John M. Poate, Diffusion and Reactions in Gold Films, *Gold Bull.*, 1981, vol. 14, pp. 2-11.
(Continued)

*Primary Examiner* — Kaj K Olsen
*Assistant Examiner* — Alexander Polyansky
(74) *Attorney, Agent, or Firm* — Oliff PLC

(57) ABSTRACT

An Ag—Au—Pd ternary alloy bonding wire for semiconductor devices made from 4-10 mass % of gold having a purity of 99.999% or higher, 2-5 mass % of palladium having a purity of 99.99% or higher, and remaining mass % of silver (Ag) having a purity of 99.999% or higher; and this wire contains 15-70 mass ppm of oxidizing non-noble metallic elements, and is thermally annealed before being continuously drawn through dies, and is thermally tempered after being continuously drawn through the dies, and this wire is useful for ball bonding in a nitrogen atmosphere; $Ag_2Al$ and a Pd rich layer produced in the interface between the Ag—Au—Pd ternary alloy wire and an aluminum pad suppress the corrosion development between the $Ag_2Al$ intermetallic compound layer and the wire.

11 Claims, 1 Drawing Sheet

(51) Int. Cl.
*H01L 23/49* (2006.01)
*H01L 23/00* (2006.01)

(52) U.S. Cl.
CPC ....... *H01L 24/05* (2013.01); *H01L 2224/04042* (2013.01); *H01L 2224/05624* (2013.01); *H01L 2224/431* (2013.01); *H01L 2224/43848* (2013.01); *H01L 2224/45015* (2013.01); *H01L 2224/45139* (2013.01); *H01L 2224/45144* (2013.01); *H01L 2224/45164* (2013.01); *H01L 2224/48463* (2013.01); *H01L 2224/48507* (2013.01); *H01L 2224/48599* (2013.01); *H01L 2224/48624* (2013.01); *H01L 2224/85075* (2013.01); *H01L 2924/0102* (2013.01); *H01L 2924/0105* (2013.01); *H01L 2924/01005* (2013.01); *H01L 2924/01006* (2013.01); *H01L 2924/01012* (2013.01); *H01L 2924/01013* (2013.01); *H01L 2924/01019* (2013.01); *H01L 2924/01029* (2013.01); *H01L 2924/01033* (2013.01); *H01L 2924/01047* (2013.01); *H01L 2924/01049* (2013.01); *H01L 2924/01057* (2013.01); *H01L 2924/01058* (2013.01); *H01L 2924/01063* (2013.01); *H01L 2924/01078* (2013.01); *H01L 2924/01079* (2013.01); *H01L 2924/01082* (2013.01); *H01L 2924/01327* (2013.01)

(56) References Cited

FOREIGN PATENT DOCUMENTS

| | | |
|---|---|---|
| JP | A-9-272931 | 10/1997 |
| JP | A-9-275120 | 10/1997 |
| JP | A-10-303238 | 11/1998 |
| JP | A-11-67812 | 3/1999 |
| JP | A-11-288962 | 10/1999 |
| JP | A-2000-150562 | 5/2000 |
| JP | A-2010-171378 | 8/2010 |

OTHER PUBLICATIONS

Nov. 29, 2011 International Search Report issued in International Patent Application No. PCT/2011/075160 (with translation).

International Preliminary Report on Patentability dated Aug. 13, 2013 issued in International Patent Application No. PCT/JP2011/075160.

\* cited by examiner

Fig. 1(A) Ag-Au-Pd wire
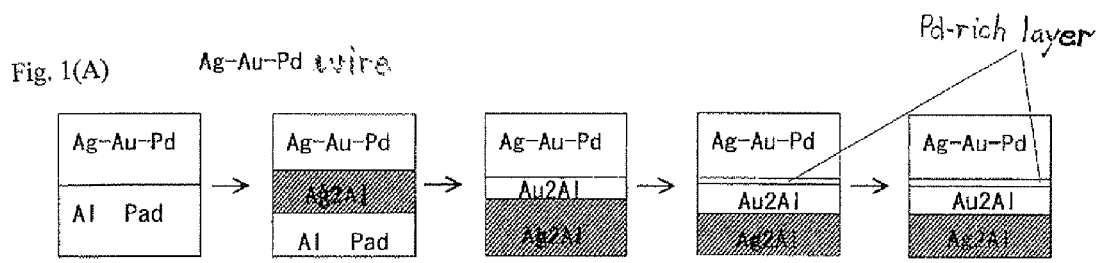
Fig. 1(B) Ag wire
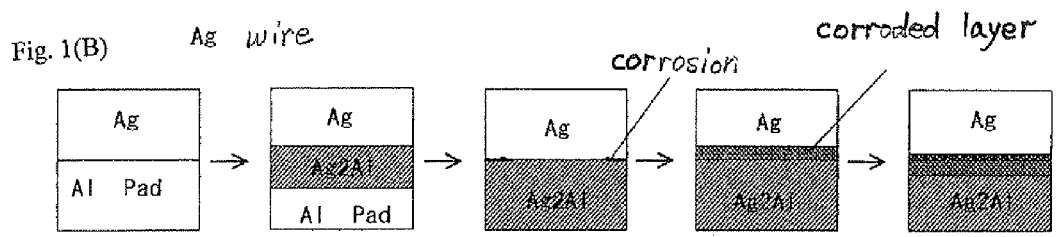

AG—AU—PD TERNARY ALLOY BONDING WIRE

TECHNICAL FIELD

The present invention relates to a bonding wire made of an Ag—Au—Pd ternary alloy suitable for connecting base plates such as IC chip electrodes and externally drawn-out leads used in a semiconductor device, and especially relates to an Ag—Au—Pd ternary alloy bonding wire used under a high temperature condition such as in an automotive vehicle or in a high speed device.

BACKGROUND TECHNOLOGY

Conventionally, as a gold wire to connect, in a semiconductor device, an IC chip electrode to an externally drawn-out lead, a gold wire having a purity of 99.99 mass % (hereinafter simply referred to as '%' in place of "mass %") or higher made of a high purity gold doped with a trace quantity of another metallic element has been used widely for the reason of high dependability. The usage of such a pure gold wire as this is such that one end of the wire is connected to a pure aluminum (Al) pad or an aluminum alloy pad on an IC chip electrode by means of a ultrasonic wave-assisted thermal bonding method, and the other end is connected to an external lead or the like on a circuit board, and thereafter the circuit is sealed with a resin to make a semiconductor device. Such a pure aluminum (Al) pad and an aluminum alloy pad as these are usually formed by vacuum deposition.

As another Ag—Au—Pd ternary alloy bonding wire, there is disclosed one in Japanese Patent Application Publication H09-272931 "a gold alloy fine wire for semiconductor devices characterized by consisting of, by weight, 10-60% Ag and 0.005-0.8% Mn, plus in combination with the above, 0.005-5% by weight, in total, of at least one element selected from Cu, Pd and Pt, and 0.0002-0.03% by weight, in total, of at least one element selected from Ca, Be, La, Ce and Y, and the balance being gold and inevitable impurities."

Also, Japanese Patent Application Publication 2000-150562 discloses "a gold alloy fine wire for bonding with semiconductor device made of a gold alloy containing Ag by 1 to 50 wt. %, Pd by 0.8 to 5 wt. %, Ti by 0.1 to 2 wt. ppm, plus one or more selected from Ca, Be and La by 1 to 50 wt. ppm and the remaining part consisting of gold and inevitable impurities." The bonding wires such as these were developed as alternative wires for gold wire and were intended to reduce the consumption of costly gold (Au) as well as to enable formation of melt ball in the atmosphere.

However, in the case of a bonding wire made of an Ag—Au—Pd alloy with the silver (Ag) content exceeding 60%, it has been experienced that when it is ball-bonded in the natural atmosphere, some oxides separate in the surface of the melt ball with a result that the ball does not bond well to the target such as an aluminum alloy pad. Such oxides originate from an oxidizing non-noble metal element or inevitable impurities contained in the raw Ag, and as such elements added in trace amounts and the inevitable impurities separate in the surface of the melt ball, they couple with the oxygen in the atmosphere and turn oxides.

When the content of silver (Ag) exceeds 60%, the rigidity of the bonding wire itself becomes so increased that it was a common practice to subject the molded bonding wire to a final annealing. For example, in Japanese Patent Application Publication H03-74851 (hereinafter referred to as "IP Publication 1") there are disclosed "wires made of Ag—Pd alloy, Au—Ag—Pd alloy, etc. which have been heat-treated at temperatures higher than the respective recrystallization temperature," and Japanese Patent Application Publication 2010-171378 discloses a method for manufacturing a wire made of a gold-silver-palladium alloy which has been drawn to a wire diameter of 0.050 mm-0.010 mm and contains gold by 8.00-30.00 wt. % and silver by 66.00-90.00 wt. % and palladium by 0.01-6.00 wt. %, consisting of cleansing and drying the wire surface and then annealing.

However, in the case of a bonding wire made of an Ag—Au—Pd ternary alloy, a fact exists that the greater the content of silver (Ag) is the more oxygen is taken in from the atmosphere so that the surface tension becomes so weak that the shape of the melt ball gets unstable and also what with the above-mentioned separation of oxides it was only possible to achieve a connection by means of ultrasonic wedge bonding.

As the semiconductor devices sealed with resin began to be used in IC's for automotive vehicles wherein high reliability is demanded in spite of the severe circumstances of heightened temperatures and also in IC's for high frequency waves and high brightness LED in which the operational temperature rises quite high, the bonding wires made of Ag—Au—Pd ternary alloys which have been finished with annealing are not capable of maintaining their properties in such high temperature situations. For these reasons the fact is that the bonding wires of Ag—Au—Pd ternary alloys have not yet been put to use.

PRIOR ART PUBLICATIONS

Publications-In-IP

[IP Publication 1]
    Japanese Patent Application Publication H03-74851
[IP Publication 2]
    Japanese Patent Application Publication H09-272931
[IP Publication 3]
    Japanese Patent Application Publication 2000-150562

BRIEF DESCRIPTION OF THE INVENTION

Problems the Invention Seeks to Solve

The present invention was made in view of providing a bonding wire of an Ag—Au—Pd ternary alloy, which is capable of creating a durable ball-bonded connection with aluminum pad that can stay connected reliably even when the resin-sealed semiconductor device in which the wire is used is subjected to severe service conditions of high temperature, high humidity and high pressure.

Means to Solve the Problems

The inventors of the present invention, paying their attention to the fact that the bonding wire made of an Ag—Au—Pd ternary alloy does not undergo oxidization as readily as cupper (Cu)-containing bonding wire, ball-bonded the former on an aluminum pad in a nitrogen atmosphere to investigate its connection durability at high temperatures. They found that they could obtain free air balls (FAB) with high sphericity in an atmosphere which was not a completely closed nitrogen atmosphere, and even without using a mixture gas of nitrogen and hydrogen, and it even sufficed to blow nitrogen gas during the formation of the melt balls.

The present inventors also added trace amounts of oxidizing non-noble metal elements to the highly pure Ag—Au—Pd ternary alloy, and by uniformly dispersing the additives in the alloy, they contrived to retain the drawn structure in the bonding wire after the continuous drawing through the dies, by preventing the crystalline grains of the Ag—Au—Pd ternary alloy from bulking by the annealing treatment, which is applied to the wire being drawn so as to remove the molding stress.

The Ag—Au—Pd ternary alloy bonding wire for semiconductor devices presently invented for the purpose of solving the above-mentioned problems is one made from silver (Ag) having a purity of 99.99% or higher, gold (Au) having a purity of 99.999% or higher and palladium (Pd) having a purity of 99.99% or higher, and this ternary alloy bonding wire is composed of 4-10 mass % of gold (Au), 2-5 mass % of palladium (Pd) and 20-100 mass ppm of oxidizing non-noble metallic elements plus residual silver (Ag); and this bonding wire has been thermally annealed before being continuously drawn through the dies and is thermally tempered after being continuously drawn through the dies and is suitable for ball bonding in a nitrogen atmosphere.

(Ag—Au—Pd Ternary Alloy)

The presently invented Ag—Au—Pd ternary alloy is an alloy made after thoroughly homogenizing a solid solution consisting of 4-10 mass % of gold (Au), 2-5 mass % of palladium (Pd) plus residual silver (Ag).

In the case of the present invention, the amount of silver (Ag) is not less than 84 mass %, and this is on account of a finding that when a silver-containing alloy wire is bonded onto a pure aluminum (Al) pad or an aluminum alloy pad in a nitrogen atmosphere, there is formed scarce intermetallic compound between silver (Ag) and aluminum (Al), which is formed when bonding is in the natural atmosphere.

With the present invention, gold (Au) does not participate in a formation of an intermetallic compound with aluminum (Al) in nitrogen atmosphere, and does have an effect of rendering the melt ball to be compressed highly circularly at the time of the first bonding. The reason why the present invention prescribes gold (Au) in an amount of 4-10 mass % is that if the gold exceeds 10 mass %, the temperature of the melt ball as it is formed becomes so high that the oxides of oxidizing non-noble metallic elements become easy to form, whereby obtaining of highly spherical FAB becomes difficult, and on the other hand, if less than 4 mass %, the melt ball gets so instable that the sphericity of FAB is not easy to secure. It is preferred that the gold (Au) content is 6-9 mass %.

In the present invention, palladium has effects of thwarting a formation of intermetallic compound between silver (Ag) and aluminum (Al), and of restricting the degradation of the intermetallic compound between sliver (Ag) and aluminum (Al) at the time of the use of the semiconductor device under conditions of high temperature and high humidity.

In the case of conventional Ag wires, an intermetallic compound $Ag_2Al$ is formed across the bonded interface between these elements.

This bonded interface between $Ag_2Al$ and the ball is corroded in circumstances containing water, whereby Ag and $Ag_2O_3$ are produced. In the case of a wire made of the presently inventive Ag—Au—Pd plus trace amounts of additive elements α, $Ag_2Al$ and a Pd rich layer are produced between the $Ag_2Al$ and the ball, whereby corrosion of $Ag_2Al$ is restricted.

As is shown in the conceptual drawings of FIG. 1, in the case of Ag wire, the intermetallic compound $Ag_2Al$ is formed across the bonded interface between the ball and aluminum pad, and is liable to undergo corrosion in water-containing circumstances [ref. (A) of FIG. 1].

In contrast to this, as shown in (A) of FIG. 1, in the case of Ag—Au—Pd wire of the present invention, although the intermetallic compound $Ag_2Al$ is similarly formed across the bonded interface between the ball and the aluminum pad, Au and Pd are so compatible to each other that $Au_2Al$ and a Pd rich layer are formed on the ball side whereby the corrosion of Al is retarded, with the result of extensively improved share strength and HST reliability.

The reason why palladium (Pd) is prescribed 2-5 mass % is that if it exceeds 5 mass %, the melt ball formed in the nitrogen atmosphere turns too hard and if it is less than 2 mass %, the effect of restricting the degradation of the intermetallic compound between sliver (Ag) and aluminum (Al) is not secured. It is preferred that the palladium (Pd) content is 3-5 mass %.

(Oxidizing Non-Noble Metallic Additive Elements)

In the present invention, the dosage of oxidizing non-noble metallic additive elements is 15-70 mass ppm. According to the present invention, the purity of silver (Ag) is required to be 99.99% or higher, and the inevitable impurities substantially amount to 20 ppm or so. These inevitable impurities as well as the oxidizing non-noble additive elements are uniformly dispersed in the Ag—Au—Pd ternary alloy, and by virtue of their flux pinning effect they discharge their mission of preventing the crystalline grains of the Ag—Au—Pd ternary alloy from bulking. The main missions of the oxidizing non-noble metallic additive elements are to improve the mechanical properties of the wire and the roundness of the compressed ball at the first bonding. If the oxidizing non-noble metallic additive elements are in a total amount of 70 mass ppm or less, then even when the Ag—Au—Pd ternary alloy is annealed in the natural atmosphere there occurs little formation of a thick oxide film in the alloy surface, which would change the color of the alloy surface. It is preferable that the total amount of the oxidizing non-noble metallic elements is 20-60 mass ppm, and more preferably 20-50 mass ppm.

The oxidizing non-noble metallic additive elements can be calcium (Ca), a rare earth element (Y, La, Ce, Eu, Gd, Nd and Sm), bellirium (Be), magnesium (Mg), tin (Sn), indium (In), and bismath (Bi). Preferable candidates are calcium (Ca), and rare earth elements, especially lanthanum (La) and bellirium (Be).

(Annealing Treatment)

The annealing treatment according to the present invention is designed to remove the molding stress caused by drawing of the Au—Ag—Pd ternary alloy and to thereby prevent the cracking caused by the stress. It is necessary that the oxidizing non-noble metallic additives are highly uniformly dispersed in the Ag—Au—Pd ternary alloy so that the temperature at which the system is heat-treated must not be raised to a proximity of the melting point of the Ag—Au—Pd ternary alloy (about 1000 degrees centigrade). Ordinarily, the heat treatment may be roughly at 500 degrees centigrade for two hours, 600 degrees centigrade for 30 minutes or 700 degrees centigrade for 10 minutes. When the alloy is drawn into a wire after the annealing, a drawn structure is formed in the bonding wire. Therefore, it is desirable that the annealing treatment is conducted before the final continuous drawing. Also, if the annealing treatment is repeated, the drawn structure of the bonding wire is thought to become more dense so that it is preferable that the annealing is done twice or more, but this impairs the productivity so that twice or thrice is the best.

(Thermally Refining Heat Treatment)

The thermally refining heat treatment according to the present invention is designed, similarly as in the case of gold wire, to modify the wire in a manner such that it would be snapped by a tensile breaking strength testing machine when it has elongated by 4%, and this is achieved through a controlling of the temperature and the wire speed within the tubular furnace. Commonly, 500 degrees centigrade and two seconds or so is adopted.

Effects of the Invention

As described above, the bonding wire of the inventive Ag—Au—Pd alloy is put to the first bonding in the nitrogen atmosphere, so that the bondability of the melt ball onto the pure aluminum (Al) pad and aluminum alloy pad is good, and it is possible to secure the circularity of the compressed ball, and even when the semiconductor device is used in a situation of high temperature and high humidity, the intermetallic compound of aluminum (Al) would not bulk in the bonded interface of the first bonding with a result that high bonding reliability is secured. Furthermore, the bonding wire made of the Ag—Au—Pd alloy of the present invention is mechanically tender so that leaning and irregularity in loop height are not experienced and the irregularity in the bonding strength during the second bonding which is conducted by ultrasonic wave bonding is reduced.

Embodiments for Practicing the Invention

Ag—Au—Pd alloys having element compositions shown in the left half of Table 1 were prepared by melt-down casting, and wires of 10 mm diameter were drawn to 3 mm diameter and annealed at 600 degrees centigrade for 30 minutes, and next the wires were drawn to a diameter of 0.1 mm and then annealed at 600 degrees centigrade for 30 minutes. Thereafter, by conducting the final and wet type continuous drawing, the inventors prepared 20-micrometer thick bonding wires 1-27 made of Ag—Au—Pd alloys according to the present invention (hereinafter referred to as inventive wires) and also bonding wires 28-36 made of Ag—Au—Pd alloy of compositions outside the compositional range of the present invention (hereinafter referred to as comparative wires). These inventive wires 1-27 and comparative wires 28-36 were set to a wire bonder (Maxμm Ultra, a product name) manufactured by Kulicke & Soffa, and were bonded onto 50-mm square Al alloy pads made of an alloy of Al plus 0.5 mass % Cu installed in a semiconductor IC chip in an atmosphere of blowing nitrogen wherein FAB's with an aimed size of 38 mm-large were made, the conditions for the bonding operation being such that the heating temperature was 200 degrees centigrade, the loop length was 5 mm, the loop height was 220 mm, the compressed ball's diameter was 48 mm, and the compressed ball's height was 14 mm, and estimation was made with respect to FAB sphericity, compressed ball circularity, 1st ball shear, and HAST reliability.

[Method for the Estimation of FAB Sphericity]

A hundred FAB's in the case of each composition of the alloys were made by means of the wire bonder, and the lengths of each FAB in X direction (perpendicular to the wire's lengthwise direction) and Y direction (wire's lengthwise direction) were measured and the difference between these lengths was the basis for the estimation. The result of the estimation is as shown in the right half of Table 1

[Method for the Estimation of Compressed Ball's Circularity]

A hundred times of bonding were conducted with respect to each composition of the alloys upon an IC chip prepared for the estimation, and the lengths of each compressed ball in X direction (perpendicular to the direction in which the ultrasonic wave was directed) and in Y direction (the direction in which the ultrasonic wave was directed) were measured, and the irregularity in the ratio between these lengths was the basis for the estimation, and the result is shown in the right half of Table 1.

[Method for the Estimation of 1st Ball Shear]

With respect to each alloy composition, a hundred times of bonding was conducted upon an IC chip prepared specially for this purpose by means of the wire bonder, and the shear strength of each 1st compressed ball was estimated by means of an "almighty Bond Tester (BT) (Type 4000)" a product name of Dage Corporation. The result of the estimation is shown in the right half of Table 1.

[Method for the Estimation of HAST Reliability]

With respect to each alloy composition, bonding was conducted upon an IC chip (200 pins) specially prepared for this purpose by means of a wire bonder, and this chip was sealed with a plastic resin specially prepared for this purpose whereby a sample for electric resistance measurement was completed. Each sample was let to sit in a highly accelerated life tester (HAST) for 192 hours under the conditions of a temperature of 130 degrees centigrade, a humidity of 85%, and a pressure of 2.2 atms; thereafter the electric resistance was measured. The measurement of the electric resistance was conducted by means of "Source Meter (Type 2004)" a product name of KEITHLEY CORPORATION, with the help of an IC socket specially prepared for this purpose in an automatic measurement system specially constructed for this purpose. The manner of the measurement was in accordance with the so-called direct current four-terminal method. A constant electric current was let to flow from a probe for measurement to a neighboring external lead probe (a pair where a pad on the chip was in short circuit was selected), and the voltage between the probes was measured.

This measurement of the electric resistance was conducted before and after the stay in the HAST with respect to 100 pairs (200 pins) of external leads, and the rate of rise in the voltage was estimated. The result of this estimation is shown in the right half of Table 1.

TABLE 1

| | | Ingredient elements (mass %) | | | oxidizing non-noble metallic elements (mass ppm) | | | | Estimated properties | | | |
|---|---|---|---|---|---|---|---|---|---|---|---|---|
| | | Ag | Au | Pd | Ca | La | Eu | Be | Sphericity of FAB | Circularity stability | 1st ball shear | HAST reliability |
| Examples | 1 | balance | 4 | 2 | 0 | 5 | 10 | 0 | ○ | ○ | ○ | ○ |
| | 2 | balance | 4 | 3 | 5 | 10 | 15 | 5 | ○ | ○ | ◎ | ◎ |
| | 3 | balance | 4.5 | 4 | 10 | 15 | 20 | 10 | ○ | ○ | ○ | ◎ |
| | 4 | balance | 4.5 | 5 | 15 | 20 | 0 | 0 | ○ | ○ | ◎ | ◎ |
| | 5 | balance | 5 | 2 | 20 | 0 | 5 | 5 | ◎ | ◎ | ◎ | ○ |
| | 6 | balance | 5 | 2.5 | 0 | 5 | 10 | 10 | ◎ | ◎ | ◎ | ○ |
| | 7 | balance | 5.5 | 3 | 5 | 10 | 15 | 0 | ◎ | ○ | ◎ | ◎ |
| | 8 | balance | 5.5 | 3.5 | 10 | 15 | 20 | 5 | ◎ | ◎ | ◎ | ◎ |

TABLE 1-continued

|  |  | Ingredient elements (mass %) | | | oxidizing non-noble metallic elements (mass ppm) | | | | Estimated properties | | | |
|---|---|---|---|---|---|---|---|---|---|---|---|---|
|  |  | Ag | Au | Pd | Ca | La | Eu | Be | Sphericity of FAB | Circularity stability | 1st ball shear | HAST reliability |
|  | 9 | balance | 6 | 4 | 15 | 20 | 0 | 10 | ◉ | ◉ | ◉ | ◉ |
|  | 10 | balance | 6 | 4.5 | 20 | 0 | 5 | 0 | ◉ | ○ | ◉ | ◉ |
|  | 11 | balance | 6.5 | 5 | 0 | 5 | 10 | 5 | ◉ | ◉ | ◉ | ◉ |
|  | 12 | balance | 6.5 | 2 | 5 | 10 | 15 | 10 | ◉ | ◉ | ◉ | ○ |
|  | 13 | balance | 7 | 2 | 10 | 15 | 20 | 0 | ◉ | ○ | ◉ | ○ |
|  | 14 | balance | 7 | 2.5 | 15 | 20 | 0 | 5 | ◉ | ◉ | ◉ | ○ |
|  | 15 | balance | 7.5 | 2.5 | 20 | 0 | 5 | 10 | ◉ | ◉ | ◉ | ○ |
|  | 16 | balance | 7.5 | 3 | 0 | 5 | 10 | 0 | ◉ | ○ | ○ | ◉ |
|  | 17 | balance | 8 | 3 | 5 | 10 | 15 | 5 | ◉ | ◉ | ◉ | ◉ |
|  | 18 | balance | 8 | 3.5 | 10 | 15 | 20 | 10 | ◉ | ◉ | ○ | ◉ |
|  | 19 | balance | 8.5 | 3.5 | 15 | 20 | 0 | 0 | ◉ | ○ | ◉ | ◉ |
|  | 20 | balance | 8.5 | 4 | 20 | 0 | 5 | 5 | ◉ | ◉ | ◉ | ◉ |
|  | 21 | balance | 9 | 4 | 0 | 5 | 10 | 10 | ◉ | ◉ | ◉ | ◉ |
|  | 22 | balance | 9 | 4.5 | 5 | 10 | 15 | 0 | ◉ | ○ | ◉ | ◉ |
|  | 23 | balance | 9.5 | 4.5 | 10 | 15 | 20 | 5 | ○ | ○ | ◉ | ◉ |
|  | 24 | balance | 9.5 | 5 | 15 | 20 | 0 | 10 | ○ | ○ | ◉ | ◉ |
|  | 25 | balance | 10 | 5 | 20 | 0 | 5 | 0 | ○ | ○ | ◉ | ◉ |
|  | 26 | balance | 10 | 2 | 0 | 5 | 10 | 5 | ○ | ○ | ◉ | ○ |
|  | 27 | balance | 4 | 5 | 5 | 10 | 15 | 10 | ○ | ○ | ◉ | ◉ |
| Comparative | 28 | balance | 5 | 0 | 0 | 40 | 30 | 0 | ○ | ○ | ○ | X |
| Examples | 29 | balance | 6 | 1 | 10 | 0 | 40 | 5 | ◉ | ◉ | ○ | X |
|  | 30 | balance | 7 | 6 | 20 | 10 | 0 | 10 | ◉ | ◉ | Δ | X |
|  | 31 | balance | 8 | 1 | 30 | 20 | 10 | 0 | ◉ | ○ | ○ | X |
|  | 32 | balance | 9 | 6 | 40 | 30 | 20 | 5 | ○ | ○ | X | X |
|  | 33 | balance | 1 | 2 | 0 | 40 | 30 | 10 | Δ | Δ | Δ | X |
|  | 34 | balance | 2 | 3 | 10 | 0 | 40 | 0 | Δ | Δ | Δ | X |
|  | 35 | balance | 3 | 4 | 20 | 10 | 0 | 5 | Δ | Δ | Δ | X |
|  | 36 | balance | 11 | 5 | 30 | 20 | 10 | 10 | Δ | Δ | X | X |

In the right half of Table 1, with respect to the sphericity of FAB, a symbol ◉ indicates that the observed difference was 1 micrometer or less, ○ indicates that it was 2 micrometer or less, and Δ indicates that it was greater than 2 micrometers.

In the right half of Table 1, with respect to circularity stability, the symbol ◉ indicates that the value of standard deviation was less than 0.8 micrometer, ○ indicates that it was 0.8 micrometer or larger but less than 1.0 micrometer, Δ indicates that it was 1.0 micrometer or larger but less than 1.5 micrometer, and x indicates that it was 1.5 micrometer or larger.

In the right half of Table 1, with respect to 1st ball shear, the symbol ◉ indicates that the shearing load was 15 gf or larger, ○ indicates that it was 12 gf or larger, Δ indicates that it was 10 gf or larger, and x indicates that either it was less than 10 gf or the ball was shorn off.

In the right half of Table 1, with respect to HAST reliability, the symbol ◉ indicates that the ratio of increase in the electric resistance value, that is, the incremental value divided by the resistance value before the sit-in in HAST, was 20% or smaller, ○ indicates that it was 50% or smaller, and x indicates that it was greater than 50%.

As is clear from the results shown in the right half of Table 1, the wire of the present invention is superior in the sphericity of molten balls, the circularity of the compressed balls, bondability of the 1st balls, and HAST reliability, whereas each of the wires of Comparative Examples 25-31 fails in at least one of the properties tested.

INDUSTRIAL APPLICABILITY

The bonding wire of the present invention is useful in such IC packages that are used in a situation of high temperature and high humidity and are wanted to be cheaper, and in those IC packages such as stacked IC and Low-k IC to which use of Cu bonding wire is not is easy, or with semiconductor devices for high brilliance LED for automotive vehicles.

BRIEF DESCRIPTION OF DRAWINGS

FIG. 1 consists of a schematic diagram (A) showing a bonded interface between an Ag—Au—Pd ternary alloy wire and an aluminum pad, and a schematic diagram (B) showing a bonded interface between an Ag wire and an aluminum pad.

The invention claimed is:

1. An Ag—Au—Pd ternary alloy bonding wire for semiconductor devices comprising:
   an alloy made from a mixture of Ag having an initial purity of 99.99% or higher; Au having an initial purity of 99.999% or higher; Pd having an initial purity of 99.99% or higher; and oxidizing non-noble metallic elements, including at least one of calcium, a rare earth element and lanthanum; the alloy comprising:
   4-10 mass % of the Au;
   2-5 mass % of the Pd;
   15-70 mass ppm of the oxidizing non-noble metallic elements, including at least one of calcium, a rare earth element and lanthanum; and
   the balance being the Ag;
   wherein the wire is thermally annealed at least once, followed by continuous drawing through dies, followed by thermal tempering,
   the wire is applicable for ball bonding in a nitrogen atmosphere and
   the wire has a HAST reliability of 50% or smaller.

2. The Ag—Au—Pd ternary alloy bonding wire for semiconductor devices as claimed in claim 1, wherein said alloy contains 6-9 mass % of said Au and 3-5 mass % of said Pd.

3. The Ag—Au—Pd ternary alloy bonding wire for semiconductor devices as claimed in claim 1, wherein said wire is thermally annealed twice or more.

4. The Ag—Au—Pd ternary alloy bonding wire for semiconductor devices as claimed in claim 1, wherein said thermal annealing is conducted at a temperature higher than a temperature at which said thermal tempering is conducted.

5. A method for manufacturing an Ag—Au—Pd ternary alloy bonding wire for semiconductor devices comprising steps of:
 (a) preparing an alloy from a mixture of Au having an initial purity of 99.999% or higher; Pd having an initial purity of 99.99% or higher; oxidizing non-noble metallic elements including at least one of calcium, a rare earth element and lanthanum; and Ag having an initial purity of 99.99% or higher;
 wherein the alloy comprises
  4-10 mass % of the Au;
  2-5 mass % of the Pd;
  15-70 mass ppm of the oxidizing non-noble metallic elements including at least one of calcium, a rare earth element and lanthanum; and
 the balance being the Ag;
 (b) preparing a wire from the alloy;
 (c) thermally annealing said wire at least once;
 (d) continuously drawing said wire through dies; and
 (e) thermally tempering said continuously drawn wire.

6. The method for manufacturing the Ag—Au—Pd ternary alloy bonding wire as claimed in claim 5, wherein said thermal annealing is conducted at a temperature higher than a temperature at which said thermal tempering is conducted.

7. The Ag—Au—Pd ternary alloy bonding wire for semiconductor devices as claimed in claim 1, wherein the wire has a difference in a sphericity of 100 free air balls (FABs) of 2 micrometers or less.

8. The Ag—Au—Pd ternary alloy bonding wire for semiconductor devices as claimed in claim 1, wherein the wire has a $1^{st}$ ball shear that is 12 gf or larger.

9. The Ag—Au—Pd ternary alloy bonding wire for semiconductor devices as claimed in claim 1, wherein the wire has a standard deviation of circularity stability of 0.8 micrometers or more to less than 1 micrometer after 100 times of bonding the wire to an IC chip.

10. The Ag—Au—Pd ternary alloy bonding wire for semiconductor devices as claimed in claim 1, wherein the wire has a difference in a sphericity of 100 FABs of 2 micrometers or less, a $1^{St}$ ball shear that is 12 gf or larger, and a standard deviation of a circularity stability of 0.8 micrometers or more to less than 1 micrometer after 100 times of bonding the wire to an IC chip.

11. The Ag—Au—Pd ternary alloy bonding wire for semiconductor devices as claimed in claim 1, wherein the temperature of the thermal annealing ranges from about 500° C. to less than about 1,000° C.

* * * * *